(12) United States Patent
Sudhir et al.

(10) Patent No.: US 11,579,444 B1
(45) Date of Patent: Feb. 14, 2023

(54) INFRARED MICROLED BASED INVISIBLE ILLUMINATION FOR EYE TRACKING

(71) Applicant: MICROSOFT TECHNOLOGY LICENSING, LLC, Redmond, WA (US)

(72) Inventors: Aswathi Sudhir, Sunnyvale, CA (US); David Charles Rohn, Fort Collins, CO (US); James Peele Terrell, Bellevue, CO (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 17/830,672

(22) Filed: Jun. 2, 2022

(51) Int. Cl.
*G02B 27/00* (2006.01)
*G02F 1/1333* (2006.01)
*G02F 1/13357* (2006.01)

(52) U.S. Cl.
CPC ....... *G02B 27/0093* (2013.01); *G02F 1/1336* (2013.01); *G02F 1/133314* (2021.01); *G02F 1/133377* (2013.01)

(58) Field of Classification Search
CPC .................................................. G02F 1/133377
See application file for complete search history.

(56) References Cited

U.S. PATENT DOCUMENTS

| 10,718,886 | B1 * | 7/2020 | Sharma | H01L 33/36 |
|---|---|---|---|---|
| 11,391,967 | B1 * | 7/2022 | Hatzilias | G02C 7/02 |
| 2018/0284464 | A1 * | 10/2018 | Lu | G02B 27/14 |
| 2020/0209628 | A1 * | 7/2020 | Sztuk | G02B 27/0176 |
| 2020/0333607 | A1 * | 10/2020 | Hatzilias | H04N 5/2256 |
| 2020/0386989 | A1 * | 12/2020 | Hatzilias | G02B 27/0093 |

* cited by examiner

*Primary Examiner* — Paul C Lee
(74) *Attorney, Agent, or Firm* — Workman Nydegger

(57) ABSTRACT

Eye-tracking systems and methods utilize transparent illumination structures having a plurality of IR μLEDs distributed within the transparent viewing area of illumination structures. The μLEDs are small enough (<100 μm) that they are not visible by a user during use of an HMD or other mixed-reality device, for example, such that they can be positioned within the line-of-sight of the user through the illumination structure and without visibly obscuring or interfering with the user's view of the mixed-reality environment by the mixed-reality device.

20 Claims, 11 Drawing Sheets

INFRARED MICROLED BASED INVISIBLE ILLUMINATION FOR EYE TRACKING

BACKGROUND

Mixed-reality systems, including virtual-reality and augmented-reality systems, have recently received significant interest for their ability to create immersive experiences for users. Conventional augmented-reality (AR) systems create an augmented reality scenario by generating holograms that are rendered in the user's line-of-sight to objects in the real world. In contrast, conventional virtual-reality (VR) systems create a more immersive experience because a user's entire view is obstructed by a virtual world.

As used herein, AR and VR systems are described and referenced interchangeably using the umbrella term "mixed-reality system(s)." Unless specifically stated or unless specifically required, as understood by one of skill in the art, the descriptions herein apply equally to any and all types of mixed-reality systems, including AR systems, VR systems, and/or any other similar system capable of displaying virtual objects to a user. Accordingly, from this point forward, the disclosure will use the term mixed-reality system to describe any of the systems referenced above.

Of note, many mixed-reality systems use one or more on-body devices, such as a head-mounted display (hereinafter "HMD"), to render a virtual environment for a user. Continued advances in hardware capabilities and rendering technologies have greatly increased the realism of virtual objects displayed within a mixed-reality environments, particularly with the use of HMDs. For example, as the user moves their head during a mixed-reality session, the rendered mixed-reality environment is automatically updated, with the holograms being repositioned, relative to the user's movement, and such that the user is provided with a proper perspective and view of the virtual objects in the mixed-reality environment.

Recent advances in this technology space also relate to the use of eye tracking systems to track a movement of the user's eyes. As a result, a mixed-reality system can also respond to a user's eye movements, in addition to their general head and body movements. In particular, by tracking a user's eye movements and the direction of the user's gaze, it is possible to position the holograms rendered by the user's HMD in such a manner that they are properly positioned in the mixed-reality environment relative to the user's gaze.

One technique for tracking eye movement and for determining the directionality of a user's gaze includes the analysis of infrared (IR) light signals that are directed towards and reflected off of a user's eyes. For instance, an HMD can be equipped with one or more IR light sources that emit IR light at the user's eyes from different directions. The HMD is also equipped with IR camera(s)/sensor(s) that are positioned at known locations relative to the IR light sources. The IR light that is reflected off of the user's eyes, referred to herein as glints, can be detected by the sensors and used to determine the XYZ location and gaze direction of the user's eyes, which correspond with the user's gaze direction in the mixed-reality environment. This is possible, for example, by analyzing position of the glints relative to the positioning of the pupil center of the eye.

To enhance the accuracy and processing performed by IR eye tracking systems, it is often desirable to position several different IR light sources around the user's eyes to create different glints off of the cornea. In some instances, multiple IR cameras/sensors can also be used for each eye, although this is not necessarily required.

Unfortunately, conventional mixed-reality systems are somewhat limited in regard to where the IR light sources can be positioned. In particular, conventional systems have historically positioned the IR light sources along the peripheral rims or other mounting structures of the HMD where the actual display lenses and screens are mounted. This peripheral placement of the IR light sources is not always optimal and can require the utilization of more light sources and/or larger and more powerful light sources than would otherwise be required if the light sources could be positioned closer or more optimally relative to the iris of the user's eyes.

Some AR systems have attempted to position IR light sources away from the peripheral rim of the display screen, closer to the user's eyes and within the user's field of view. However, these types of existing systems are problematic in that they can create visual obstructions to the user's perspective of the mixed-reality environment. In particular, existing IR light sources are typically sized in the 1.0 mm to 4.0 mm diameter/width range. Such sizes are very noticeable, particularly when positioned within the user's field of view. For at least this reason most conventional systems have only positioned the IR light sources in a suboptimal location along the peripheral rim of the lenses/displays.

In view of at least the foregoing issues, there is an ongoing need and desire for improved systems and techniques for performing IR eye tracking in mixed-reality devices, particularly for AR devices.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

The disclosed embodiments include eye-tracking systems and methods, such as, but not limited to improved systems and techniques for performing IR eye tracking in mixed-reality devices, particularly for AR devices, and in a manner that is not constrained by the form factor of the rims and other structures used to mount the lenses/displays used to render the mixed-reality environment.

In some instances eye tracking systems are configured with display components, such as illumination lenses, or other display components (powered or unpowered) having IR micro-LEDs (also referred to herein as microLEDs, mLEDs, or µLEDs), which are embedded within or disposed directly on top of the surfaces of the display component (e.g., lens or other display component). In such embodiments, the IR µLEDs are positioned within the peripheral boundary of the rims or other structures that are used to mount the display component to the HMD/AR devices.

The size of the IR µLEDs, with a range from about 10 um (square) to abut 100 um (square) enables their positioning directly in front of a user's field of view or line-of-sight, and without being visibly perceived or obstructive to the user's view of the mixed-reality environment. As a result, the IR µLEDs are essentially invisible to the user during use, while also providing sufficient illumination and optimal placement for facilitating tracking of the user's eye movements during use.

Some embodiments also include HMDs or other mixed-reality devices (e.g., AR/VR devices) that include lenses/displays having a plurality of µLEDs (<1 mm width/diameter) that are configured to emit light in the IR spectrum for performing eye tracking by the mixed-reality devices and which are embedded directly into the lenses/displays of the mixed-reality devices that are used to render the virtual objects presented in the mixed-reality environments. In these embodiments, the positioning of the IR µLEDs on the HMD are beneficially not constrained to the particular form factor of the rims or other structures that are used to mount the lenses and/or other display component used for rendering the mixed-reality environment.

Some embodiments are also directed to the actual structures that are used for assembling the lenses or other display components that are configured for being positioned directly in front of a user's eyes during use within an HMD or other mixed-reality device and that are composed of a substantially transparent substrate. This substrate is configured with a plurality of IR µLEDs affixed to and/or embedded within the viewing area of the illumination structures. These illumination structures can be formed into different sizes and shapes for assembly into different types of user devices, such as, but not limited to mixed-reality devices.

Some embodiments also directed to the processes for manufacturing lenses with a plurality of IR µLEDs affixed to and/or embedded within the lenses, as well as processes for manufacturing eye tracking devices, such as, but not limited to mixed-reality devices, which incorporate the lenses having the IR µLEDs.

Some embodiments are also directed to the methods and systems used for performing eye tracking based on IR light that is generated by IR µLEDs affixed to and/or embedded within lenses of a mixed-reality device. These processes include detecting and measuring IR light which is reflected off of a user's eye(s) after being generated by the IR µLEDs.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the embodiments may be realized and obtained by means of the instruments and combinations particularly pointed out in the appended claims. Features of the present embodiments will become more fully apparent from the following description and appended claims or may be learned by the practice of the embodiments as set forth hereinafter.

BRIEF DESCRIPTION OF THE DRAWINGS

In order to describe the manner in which the above-recited and other advantages and features can be obtained, a more particular description of various embodiments will be rendered by reference to the appended drawings. Understanding that these drawings depict only sample embodiments and are not therefore to be considered to be limiting of the scope of the invention, the embodiments will be described and explained with additional specificity and detail through the use of the accompanying drawings in which.

DETAILED DESCRIPTION

Figure 1:
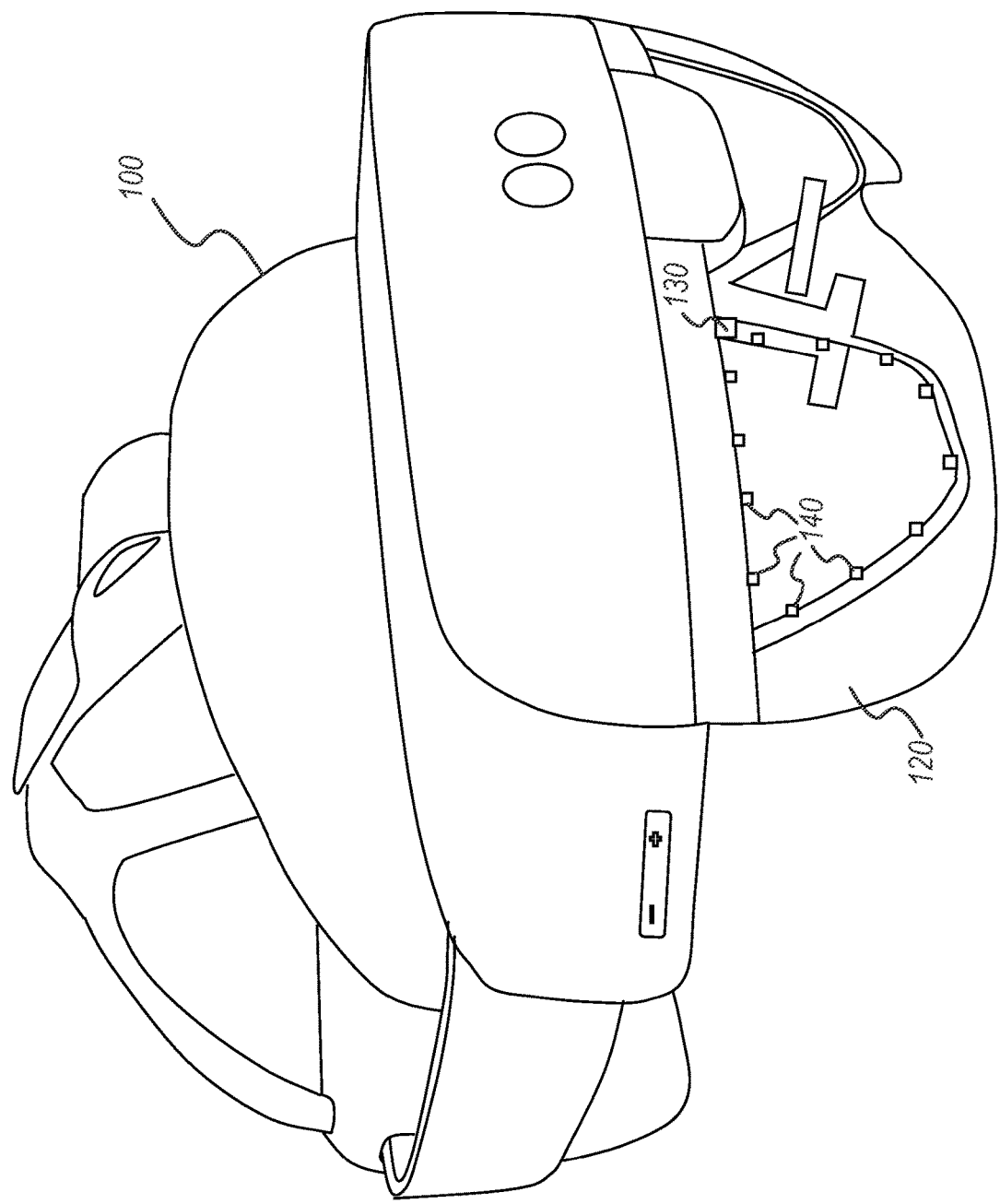
FIG. 1 illustrates an example of an HMD.

Disclosed embodiments comprise and/or utilize transparent illumination structures having a plurality of IR µLEDs distributed within the transparent viewing area of illumination lens structures. In some embodiments, the transparent illumination structures are incorporated into HMD devices that perform eye tracking based on light emitted from the IR µLEDs.

With regard to the embodiments that describe or perform eye tracking, it will be appreciated that this eye tracking can be performed for a user's left eye, a user's right eye, or a combination of the user's left and right eyes. Therefore, the embodiments are not limited to tracking only a single eye, nor do they necessarily require tracking movements of both eyes. Additionally, for brevity, the disclosure will (from this point forward) present examples related to only a single eye. These examples are for illustrative purposes only, and it will be appreciated that the principles may equally be applied to scenarios involving more than one eye.

With regard to the term lens, which is used throughout this disclosure, it will be appreciated that the term lens can be broadly interpreted to include both powered and unpowered configurations. For instance, a lens can include display components that are configured with optical power to perform an optical function in a mixed-reality application (e.g., filtering, displaying, etc.). Additionally, the term lens should also be broadly interpreted to include entirely passive structures, such zero-power transparent materials. In either instance, the lens is configured for being positioned in front of a user's eyes during use of a mixed-reality device and through which a user can visually perceive real-world objects, including other display components of an HMD. In most embodiments, the lens is a substantially planer or flat structure on which the referenced micro-LEDs can be positioned (on either side of the lens and/or within the lens material).

As previously mentioned, the disclosed embodiments may be implemented to overcome many of the technical difficulties and constraints associated with tracking a user's eye, and particularly with regard to tracking a user's eye movements when using an HMD. In particular, the disclosed embodiments enable IR light sources to be positioned directly within the viewing area of the HMD lenses, at optimal orientations relative to the user's eye/iris and corresponding camera sensors, without obstructing the user's view of the mixed-reality environment, and without constraining the positioning of the IR light sources to the rims or other HMD structures positioned outside the periphery of the lens viewing area. This is possible, according to the disclosed embodiments, by utilizing illumination lens structures having IR μLEDs that are smaller than 100 μm in any given direction. These micro-LEDs are not perceptible by a user, even though they are embedded within the lenses of the HMD, and do not, therefore, obstruct or interfere with the presentation of the mixed-reality environment by the HMD during use.

Attention will now be directed to FIG. 1, which illustrates a representation of an HMD 100. In this embodiment, the HMD 100 includes one or more lenses (110, 120) that are used to provide different optical benefits to the user of the HMD. One such benefit can be the display/rendering of holograms or projections that are perceived by the user to exist in their environment. Another benefit that can be provided by the lenses includes filtering light that exists in the ambient environment.

In some instances, the HMD is also configured to perform eye tracking, based on detected light reflections (glints) that are captured by a camera 130 or other sensor (e.g., a silicon photomultiplier (SiPM) sensor or other type of sensor). For instance, during use, light is emitted from one or more light sources (e.g., IR LEDs 140, of which only four are called out), which may surround the user's eye. After the light is emitted, glints are reflected off of a user's eye (particularly the user's iris) and detected by the camera 130. Depending on the intensity/strength of the light that is perceived, relative to source/timing of the light being emitted, the HMD light processing module can detect the positioning (relative location and orientation) of the user's eye/iris.

Additional processing of imagery captured by the system cameras/sensors can also be used to distinguish the user's pupil from the user's iris. Such imagery can help the system map the location of the user's eye and orientation/gaze of the user's eye relative to a projected hologram or other object, for instance, to detect user attention/focus. Knowing the user's eye positioning can also be used by the system to position and reproject holograms within the mixed-reality environment at desired locations relative to the user's visual perspective of the mixed-reality environment.

Figure 2:
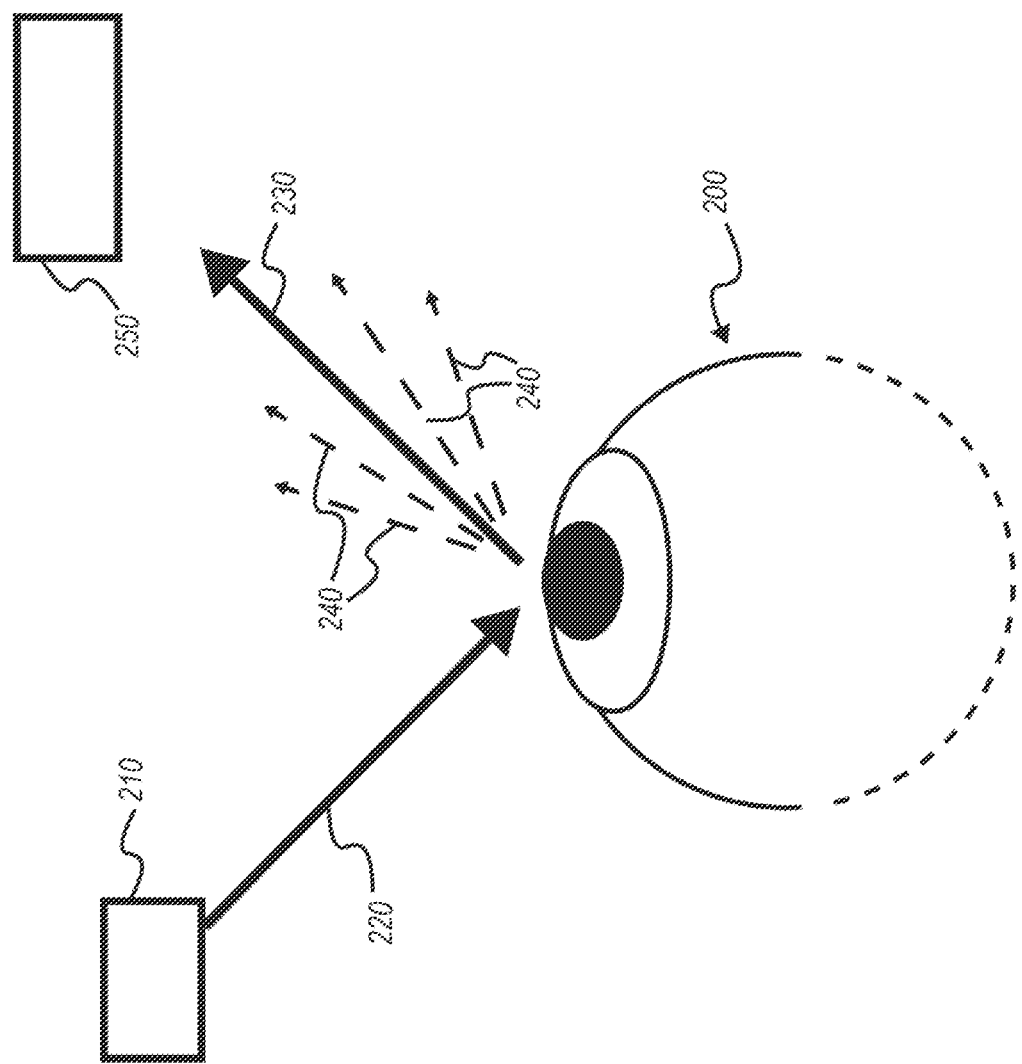
FIG. 2 illustrates a representation of IR light reflecting off of a user eye with specular and scatter reflections.

FIG. 2 illustrates a representation of a user's eye 200 in which an IR light source 210 (e.g., an IR LED) is emitting IR light 220 towards the user's eye 200. The IR light 220 is reflected back as both specular reflections 230 and as scatter reflections 240. This illustration also shows how a camera 250 or other sensor (generally referred to herein as a camera) can be positioned to detect one or more of the reflections.

By knowing the location of the light source(s), and the timing for emitting the light from the light source(s), as well as the location of the camera(s) and the measured intensity and timing of the detected light reflections that are reflected off of a user's eyes, a system can ascertain the relative positioning (location/orientation) of the user's eye/iris. This is possible, in part, because light reflects differently off of different portions of the user's eyes (e.g., it reflects differently off of the pupil and iris area of the cornea than the sclera). These differences are detected and measured, in part, based on whether the reflections are specular or scatter reflections.

More detail will not be given at this time, regarding the measuring and processing of reflected light signals for identifying the position of a user's eye, inasmuch as this type of eye tracking is well understood to those of skill in the art.

However, with regard to the structures used to perform eye tracking, specifically the IR light sources, it will be noted that it would be desirable, in some instances, to position the light sources (e.g., light sources 140 at a location within the rim 150 or other mounting structures of the HMD), so that the light sources can be positioned more optimally and closer to the user's cornea, for example.

For instance, it would be desirable to position the light sources, in some instances, off of the rim 150 and directly into or on the lenses that the user looks through, even though they would be within the user's line-of-sight that passes through the lens area contained within the peripheral edge of the lens 110. Unfortunately, conventional IR light sources are too large (e.g., 1-4 mm) to position within a user's line-of-sight without causing obstructions to the user's view of their environment viewed through the lens 110.

To help address these problems, the current embodiments include illumination lenses configured with IR μLEDs that are distributed within the bounded lens area and user's line-of-sight. With these configurations, it is possible to optimally place the light sources proximate the user's eye and without having to account for the existing constraints imposed by the physical form factors of the HMD mounting structures.

Figure 3:
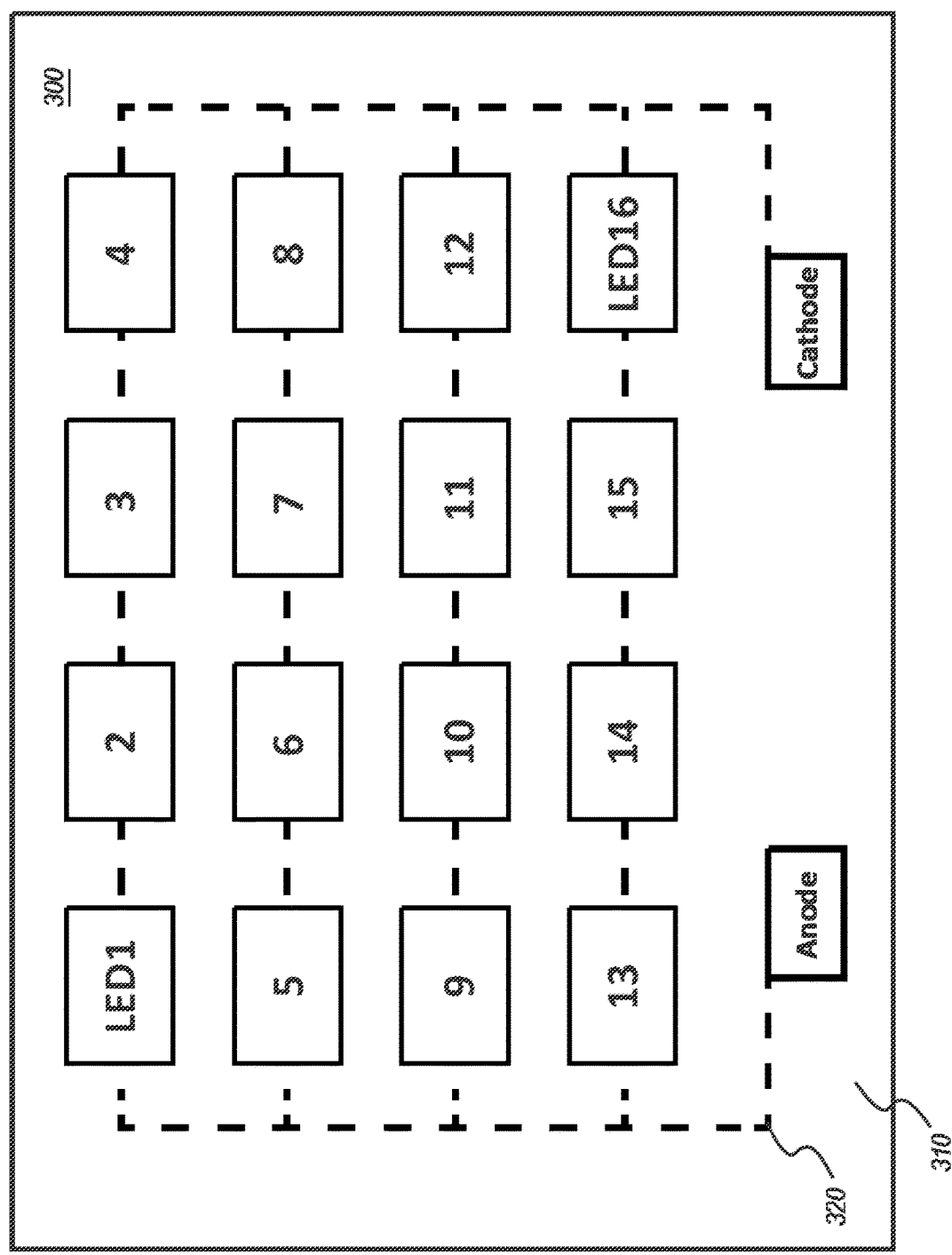
FIG. 3 illustrates a representation of a substrate or transparent structure that is operationally configured with a plurality of IR µLEDs that are distributed in a grid pattern.
Figure 4A:
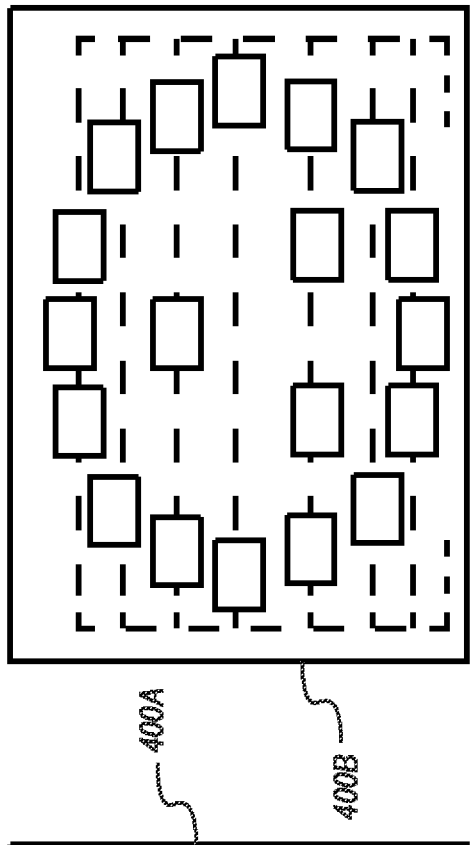
FIGS. 4A-4D illustrate additional representations of substrates or other transparent structures that are operationally configured with a plurality of IR µLEDs having different distribution patterns.
Figure 4B:
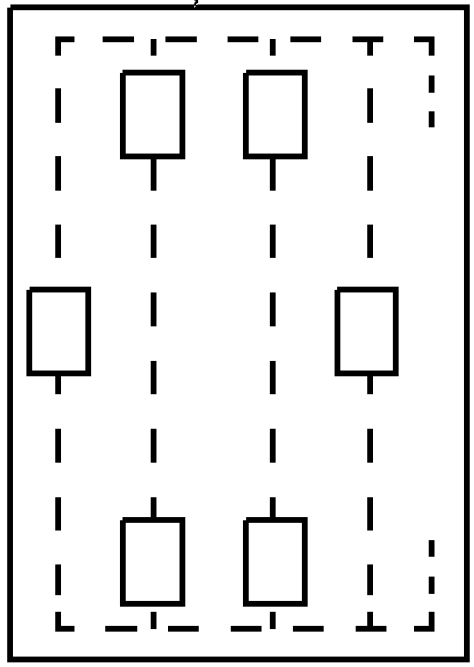
Figure 4C:
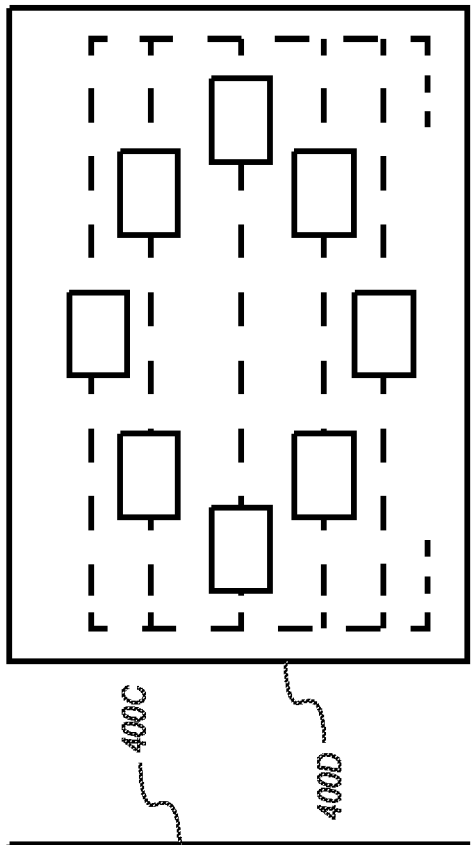
Figure 4D:
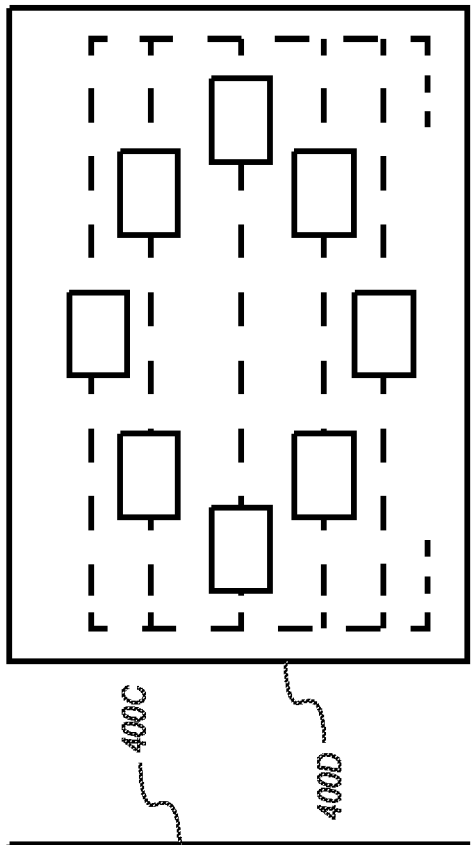

FIG. 3 illustrates one representation of an IR μLED lens structure 300 having sixteen IR μLEDs (labelled as LED1, 2, 3, 4, 5, 6, 7, 8, 9, 10, 11, 12, 13, 14, 15, LED16) arranged in a grid pattern. The IR μLEDs are positioned on transparent substrate 310, along conductive traces 320 that form an electric circuit between an anode terminal and a cathode terminal. When this circuit is powered by a power source of the HMD, for example, which is not shown but which can be electrically connected to the anode and cathode terminals and controlled by an illumination control unit, the IR μLEDs will be activated and emit IR light.

The wavelength of light that is emitted from the IR μLEDs falls within the range of between about 790 μm and 1 mm. In some preferred embodiments, the IR μLEDs emit light at a wavelength of about 800-900 μm and even more preferably about 850 μm.

While the grid pattern shown is one possible distribution of IR μLEDs, it will be appreciated that there are many different layouts and patterns that may be used for distributing the IR μLEDs on/within the illumination lens structures described herein. It will also be appreciated that it is possible for different IR μLEDs in the set of distributed IR μLEDs to each emit the same and/or different spectrums of light. By emitting different spectrums, for instance, it is possible to identify the source of the light more easily when measuring the light reflections. Furthermore, while all of the IR µLEDs may be contained on a single circuit, as shown, it is also possible to position different IR µLEDs on different circuits that are electrically insulated from each other (not presently shown), so as to enable selective control over the illumination by the different IR µLEDs at different known moments in time. This can also help the system identify the location of different IR µLEDs that are activated at any particular time.

To further illustrate the capability of modifying the distribution of the IR µLEDs on the illumination lens structures, some additional non-limiting examples will now be provided.

For instance, as shown in FIGS. 4A-4D, the quantity of IR µLEDs presented on the different illumination lens structures, and their overall distribution patterns are varied. Even more particularly, the distribution pattern of the IR µLEDs (shown as small rectangular boxes) is somewhat circular/oval in FIG. 4A, but somewhat rectangular in FIG. 4C, and somewhat diamond-shaped in FIG. 4D. The embodiment shown in FIG. 4B, on the other hand, includes two different patterns, an outer pattern that is circular/oval and an inner pattern that is triangular.

Additionally, while the illumination lens structure 400A comprises six (6) IR µLEDs, the illumination lens structures 400C and 400D each comprise eight (8) IR µLEDs. The illumination lens structure 400B contains nineteen (19) IR µLEDs.

The different quantities and patterns of IR µLEDs can be varied to accommodate different needs and preferences, including, but not limited to varied needs to illuminate larger or smaller areas, to illuminate more intensely for certain ambient environments and use scenarios, to illuminate from further distances to accommodate different lens form factors, to consume less power, to perform more precise tracking/measurements, etc.).

Figure 5:
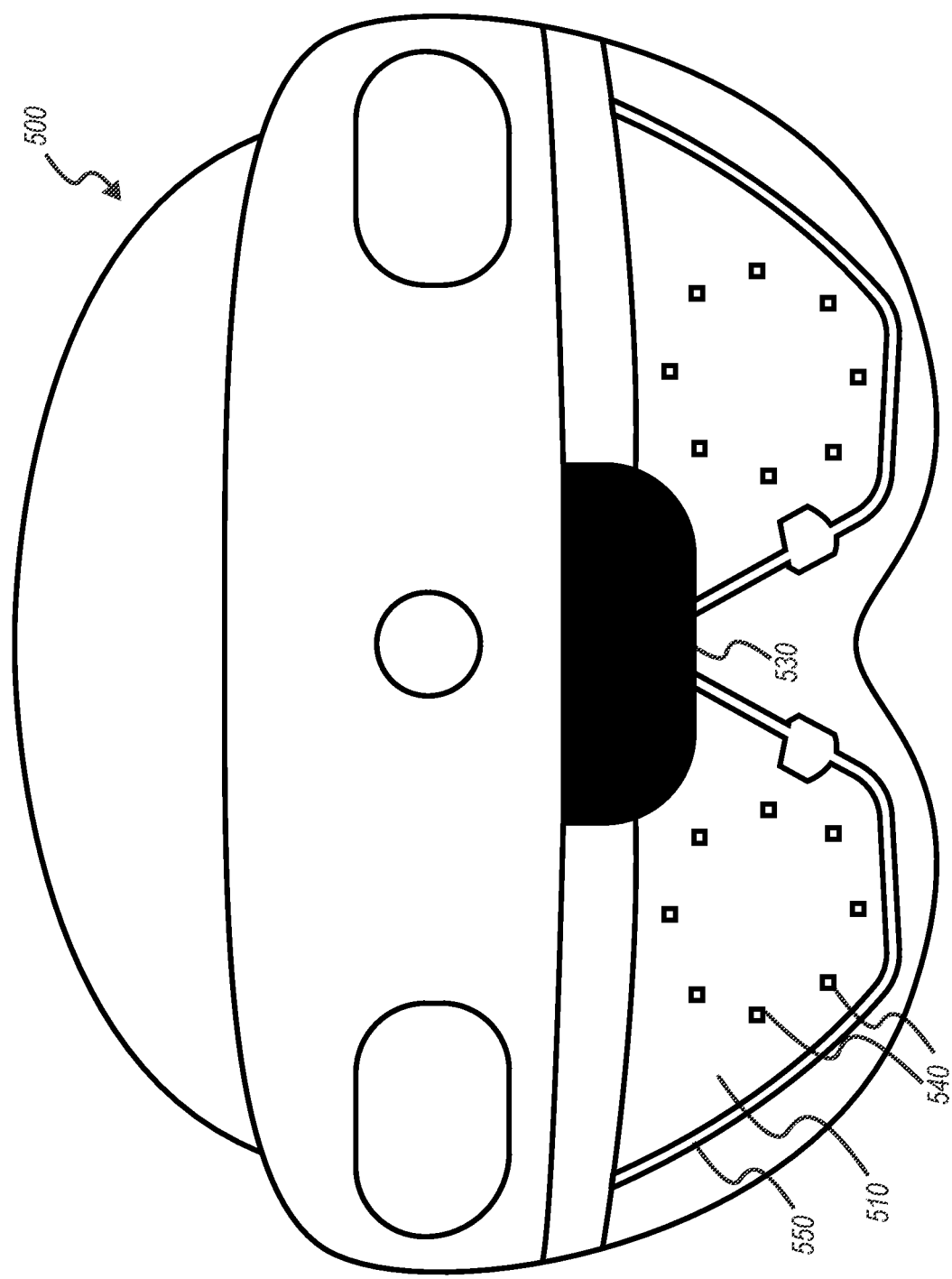
FIG. 5 illustrates a representation of a HMD configured with a display component having a plurality of IR µLEDs embedded within or on top of the display component, within the peripheral boundary of the mounting rim and structures used to secure the display component to the HMD.
Figure 6:
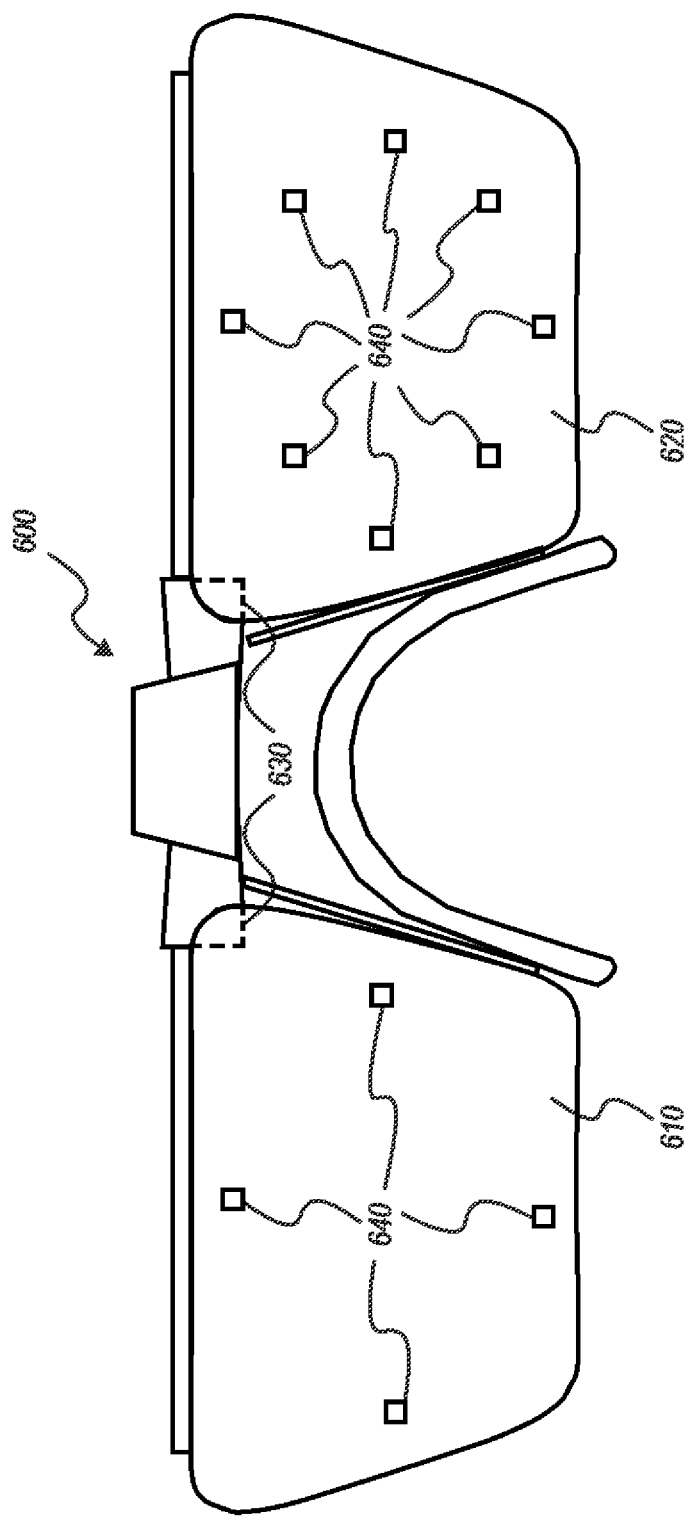
FIG. 6 illustrates a representation of a lens assembly for use with a device configured to perform eye tracking and that includes a plurality of IR µLEDs embedded within or on top of the lens, positioned to be within the line-of-sight of a user when the lens assembly is positioned in front of the user's eyes during use.
Figure 7:
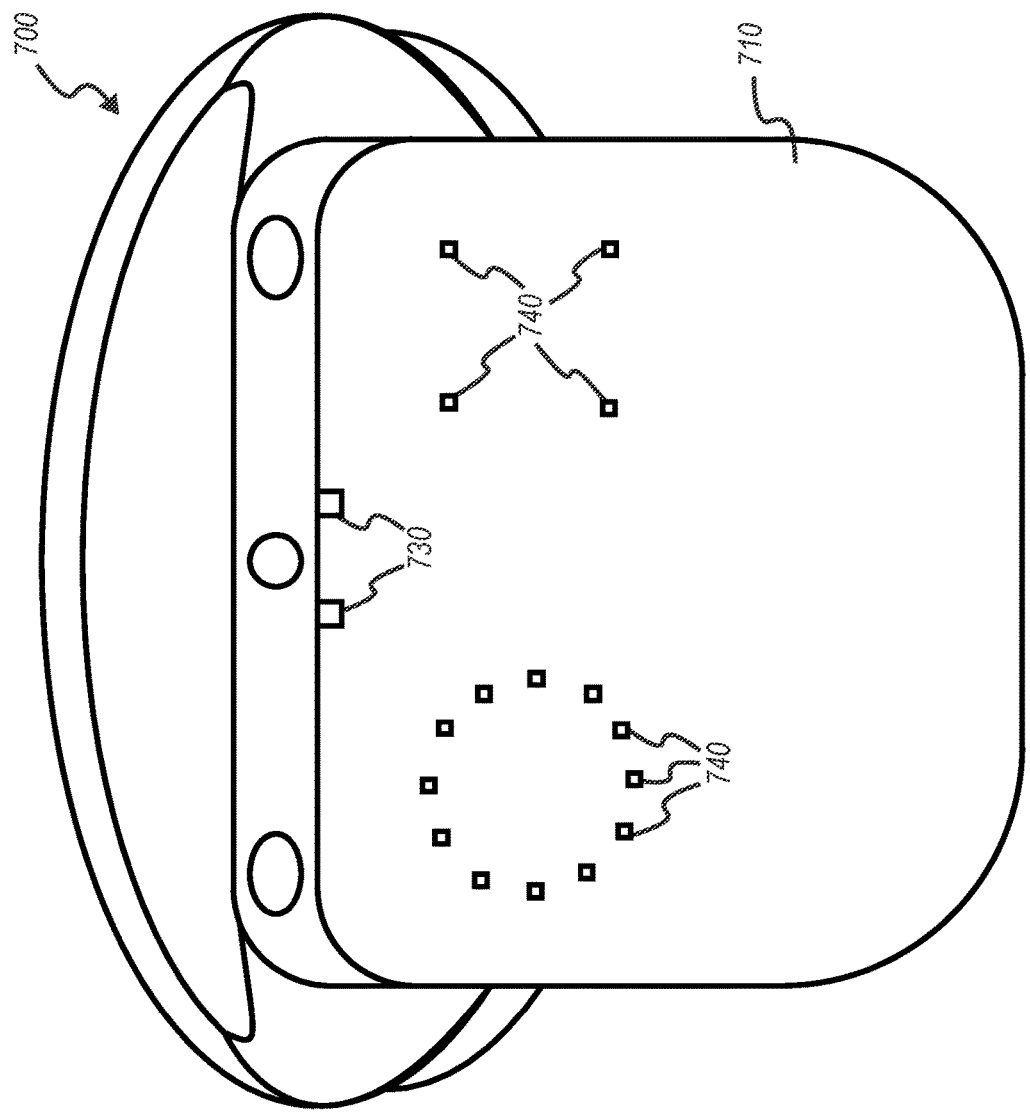
FIG. 7 illustrates a representation of a visor assembly for use with a device configured to perform eye tracking and that includes a plurality of IR µLEDs embedded within or on top of the transparent visor, positioned to be within the line-of-sight of a user when the visor is worn by a user eyes during use.

To further illustrate the possible variations in which the IR µLEDs can be distributed on/within the illumination lens structures, attention is directed to FIGS. 5-7. These illustrations show representations of the illumination lens structures embodied within an HMD or other device that is configured to perform eye tracking. These HMD devices can comprise, for example, mixed-reality devices (AR and/or VR devices) that are configured to track user eye movements and to render holograms in a mixed-reality environment based at least in part on the detected positioning of the user's eye(s).

In FIG. 5, an HMD 500 is configured with a transparent illumination lens structure 510 that has a plurality of IR µLEDs 540 (only two of which are specifically called out). As shown, the IR µLEDs 540 are distributed in a circular pattern, eight (8) for each eye and lens area. The different IR µLEDs 540 can optionally be connected on a single circuit or two or more different circuits. The electrical traces forming the circuit are not shown. Light emitted from the IR µLEDs will be directed at least partially towards the user's eye(s) during use and at least some of that light will be reflected back and detected by the device camera 530.

FIG. 6 shows another embodiment of a pair of glasses 600 having a first transparent illumination lens structure 610 that includes four (4) IR µLEDs and a second transparent illumination lens structure 620 that includes eight (8) IR µLEDs. This example is used to illustrate that it is not essential for both sides of an HMD to have matching/symmetric distribution of the IR µLEDs. Regardless of the quantity and distribution of the IR µLEDs, it will be appreciated that the light emitted from the IR µLEDs will be directed at least partially towards the user's eye(s) during use and at least some of that light will be reflected back and detected by the device camera(s) 630. Additionally, the different IR µLEDs 640 can optionally be connected on a single circuit or two or more different circuits. The electrical traces forming the circuit are not shown.

In a related embodiment, the HMD system 700 shown in FIG. 7 includes a transparent illumination lens structure 710 having the general configuration of a visor. In this example, one side of the visor has several IR µLEDs forming a circular pattern (only a few of the IR µLEDs 740 are specifically called out). The other side of the visor has four (4) IR µLEDs distributed in a square pattern. In other embodiments (not shown), both sides of the visor have a same quantity of IR µLEDs and/or distribution pattern of the IR µLEDs. Regardless of the quantity and distribution of the IR µLEDs, it will be appreciated that the light emitted from the IR µLEDs 740 will be directed at least partially towards the user's eye(s) during use and at least some of that light will be reflected back and detected by the device camera(s) 730. Additionally, the different IR µLEDs 740 can optionally be connected on a single circuit or two or more different circuits. The electrical traces forming the circuit are not shown.

With regard to all of the foregoing examples, it will be appreciated that the IR µLEDs are not shown to scale. In fact, to the contrary, the IR µLEDs are so small (<100 µm), as are the thicknesses of the traces, that they would not be perceptible on the current illustrations if they were represented at scale. This is beneficial, however, for the IR LEDs to be so small, so they can be used to illuminate a user's eye with IR light, while being positioned within/on the lens that the user looks through and without obstructing the user's view through the lens.

The electrically conductive traces are also very thin, having a width of <50 µm or even <25 µm, such that they are visually unnoticeable and essentially invisible to the user during use with close proximity to the user's eyes. This configuration is particularly beneficial for enabling the traces to be positioned within or on the illumination lens structures, within the user's line-of-sight through the lenses, and without obstructing the user's view of the environment perceived through the lens during use, even if they are positioned directly in front of the user's eye.

Figure 8:
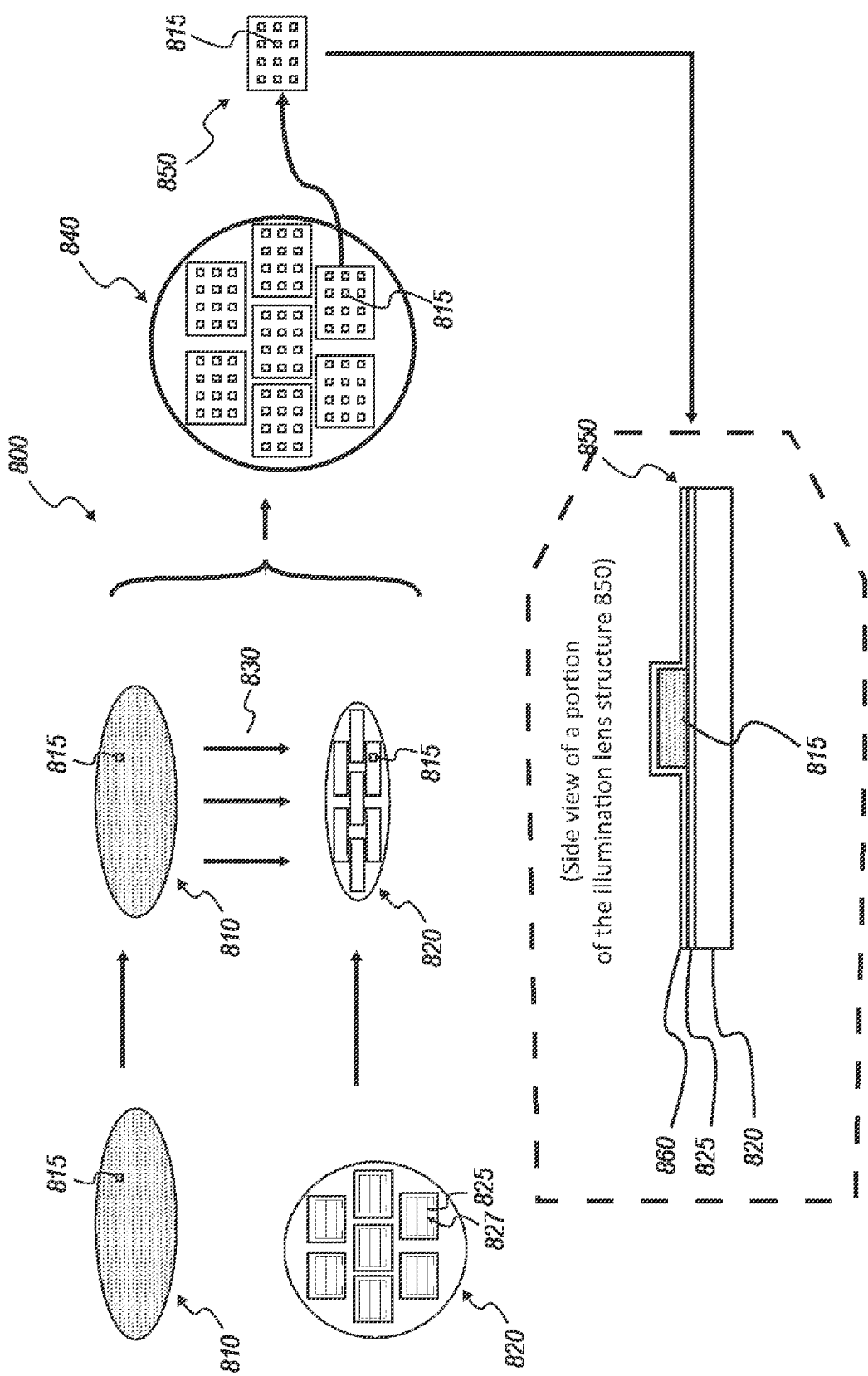
FIG. 8 illustrates a representation of a manufacturing process flow for manufacturing a substrate or transparent structure with a plurality of IR µLEDs.

Attention will now be directed to FIG. 8. This illustration visualizes a manufacturing flow for manufacturing the illumination lens structures described herein, which include IR µLEDs embedded within or otherwise distributed on the illumination lens structures, within the area circumscribed by the edge boundaries of the illumination lens structures.

As shown, the manufacturing process includes obtaining a wafer 810 comprising one or more IR µLEDs, although only a single IR µLED (815) is specifically singled out on the wafer 810. This wafer 810 may be an epi wafer or epitaxy wafer, for example, which is formed through an epitaxy growth or deposition process. In some instances, the wafer comprises a surface area containing tens, hundreds or even thousands of GaAs-based IR microLEDs that are formed on the wafer with an epitaxy growth.

These IR µLEDs are extractable and transferable to a substrate, for example, by a laser lift-off or an elastomeric transfer. Details regarding laser lift-off processes and elastomeric transfer processes will not be described at this time, as such processes are known and used for extracting/transferring other types of LEDs from epi wafers. Such processes can also be used for extracting/transferring the IR µLEDs described herein.

The process 800 represented in FIG. 8 also includes obtaining the substrate 820 to transfer the IR μLEDs onto. As shown, a transfer process 830 (e.g., laser lift-off or elastomeric transfer) is performed to transfer one or more of the IR μLEDs onto electrically conductive traces 825 that are already positioned on the substrate 820 and that form one or more different circuits 827 on the substrate.

The sizes of the IR μLED that are removed from and positioned on the substrate are each constrained to <100 μm in any direction (e.g., width, length, and height), such that the maximum dimension of any measurable length across any portion of the IR μLEDs, in some embodiments, even corner to corner is <100 μm. In some instances, the maximum size dimension of the IR μLEDs is <75 μm, or <50 μm, or even <20 μm. In some embodiments the maximum size dimension of the IR μLEDs is about 10 μm.

The width of the traces is also similarly constrained, so as to not have a thickness of greater than <50 μm, <40 μm, <30 μm, or even <20 μm. In some instances, the width of the traces is about 20 μm. In this regard, it will be appreciated that the width of the traces may vary to achieve/control a desired impedance of the traces. The traces are preferably composed of a conductive metal, such as Ag, Cu or Al.

In some embodiments, the substrate 820 comprises a transparent PCB ceramic or glass structure. In other instances, the substrate 820 is composed of a flexible transparent plastic material (e.g., PET thin film). The thickness of the substrate 820 can vary to accommodate different needs and preferences. In some instances, the substrate 820 has a thickness in a range of between 0.05 mm and 0.2 mm, and preferably about 0.1 mm. The substrate 820 is also referred to herein as a backplane.

After the illumination lens structure or IR wafer assembly 840 is configured, comprising the composite assembly of the IR μLEDs transferred to the substrate and corresponding traces/circuits on the wafer, one or more segments/portions of the IR wafer assembly 840 can be cut out or separated from the rest of the assembly 840 as stand-alone illumination lens structures 850. Optionally, before or after separating the discrete illumination lens structures 850 from the rest of the assembly 840, the illumination lens structure 850 can be coated with a protective coating 860 and/or laminated with one or more other lens materials to provide special protection and/or optical properties to the IR μLEDs and illumination lens structure 850.

Figure 9:
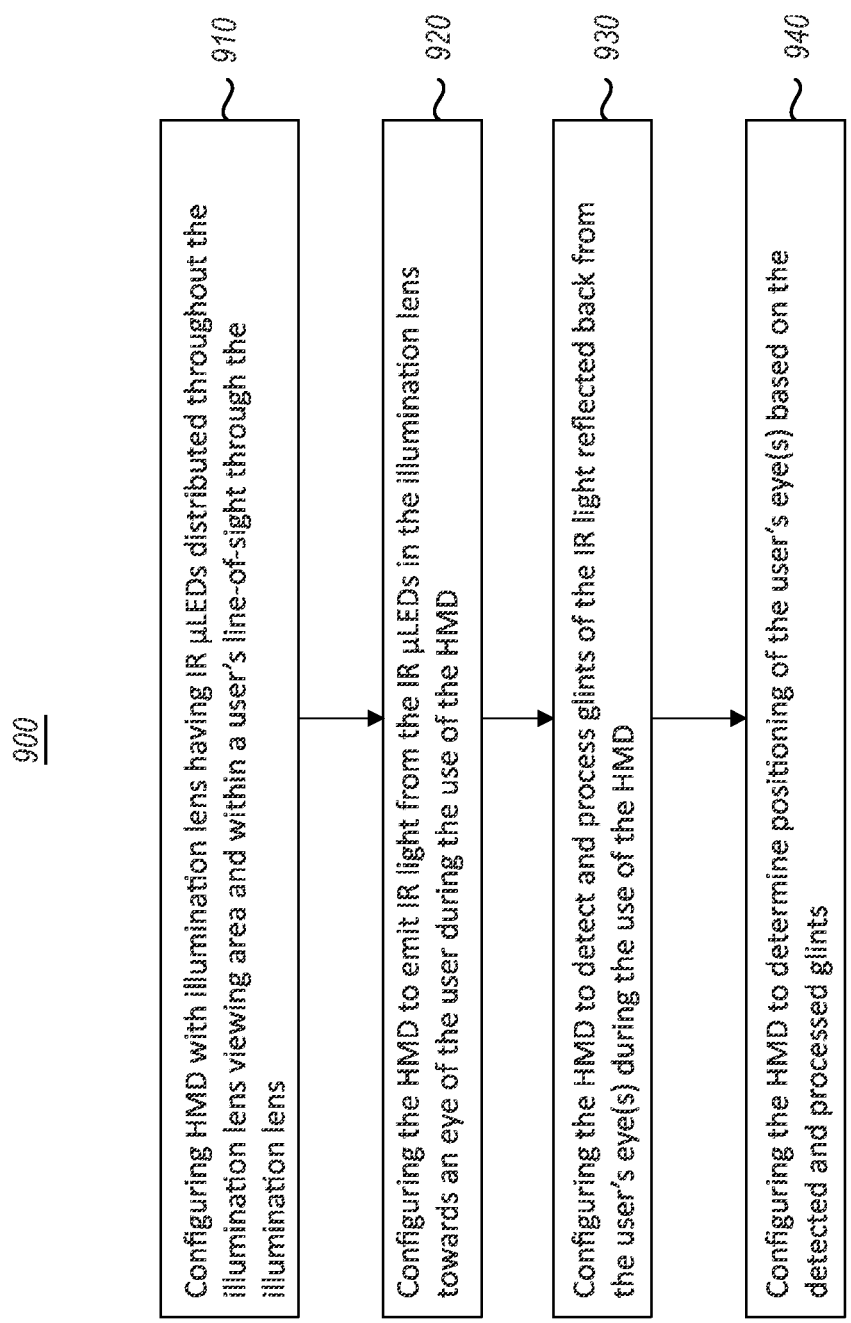
FIG. 9 illustrates a flow chart that includes acts associated with methods for manufacturing a substrate or transparent structure having a plurality of IR µLEDs embedded within or on top of the planar surface of the transparent structure.

Attention will now be directed to FIG. 9, which illustrates a flow diagram 900 of acts associated with methods for configuring an HMD device to perform eye tracking, wherein the HMD includes an illumination lens that contains a plurality of IR μLEDs, and each IR μLED of the plurality of IR μLEDs has a maximum size dimension of <100 μm.

The first illustrated act includes the configuring of the HMD with the illumination lens in such a manner that at least one of the IR μLEDs, which is contained inside of a peripheral edge boundary of the illumination lens, is positioned in a user line-of-sight area that passes through the illumination lens (act 910), as described above.

Next, the HMD is also configured to emit IR light from one or more of the IR μLEDs in the illumination lens towards an eye of the user during the use of the HMD (act 920), based on the positioning of the illumination lens on the HMD and by controlled illumination of the IR μLEDs by the system components described below in reference to FIG. 11, for example.

Next, the HMD is further configured to detect and process glints of the IR light that is reflected back from the user's eye during the use of the HMD (act 930) and to determine a positioning of the user's eye based on the detected and processed glints (act 940). The system components described below in reference to FIG. 11 can also be used to perform this functionality, such as, for example, the disclosed I/O interfaces 1120, camera(s)/sensor(s) 1130, illumination control module 1150, light processing module 1160, processor(s) 1120 and code 1170.

Figure 10:
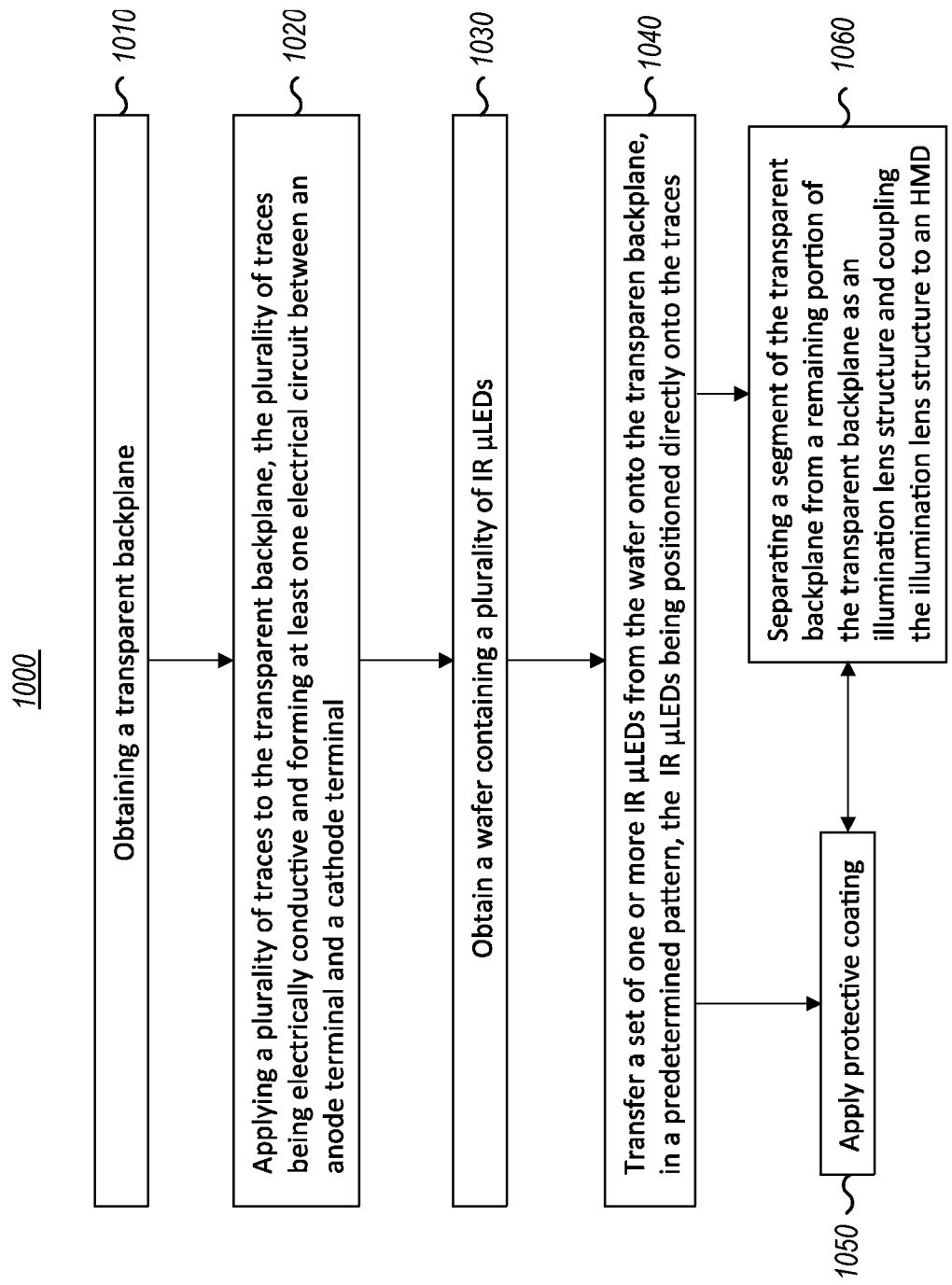
FIG. 10 illustrates a flow chart that includes acts associated with configuring systems to perform eye tracking based on IR light emitted from a transparent illumination structure having a plurality of IR µLEDs distributed within the transparent viewing area of illumination structure.

Attention will now be directed to FIG. 10, which illustrates a flow diagram 1000 of acts associated with methods for manufacturing an illumination lens structure with a plurality of IR μLEDs (infrared micro light emitting devices). As shown, the acts include an act for obtaining a transparent backplane or substrate (act 1010). Such a substrate 820 or backplane is illustrated and described in reference to FIG. 8.

The illustrated acts also include applying a plurality of traces to the transparent backplane (act 1020), wherein the plurality of traces is electrically conductive and forming at least one electrical circuit between an anode terminal and a cathode terminal. Various known techniques for forming the traces can be utilized, include various deposition and etching processes known to those of skill in the art.

The illustrated acts also include the obtaining of an IR μLED wafer (act 1030), such as the epitaxy wafer 810 referenced in FIG. 8, which contains a plurality of IR μLEDs or material that can be separately extracted as discrete IR μLEDs having a maximum dimension of <100 μm.

Next, a set of one or more of the IR μLEDs are transferred to the substrate/backplane (act 1040), directly on the traces/circuits of the transparent backplane/substrate, in a predetermined pattern, and such that the IR μLEDs are electrically coupled to at least one electrical circuit on the backplane/substrate.

In some instances, a segment of the transparent backplane is also separated from a remaining portion of the transparent backplane (act 1060), thereby forming a stand-alone illumination lens structure that includes at least one electrical circuit with the referenced set of one or more IR μLEDs.

The disclosed embodiments also include applying one or more protective coating to the illumination lens structure before or after it is separated from the rest of the transparent backplane.

Although not illustrated, the disclosed acts can also include electrically and mechanically coupling the illumination lens structure to a HMD (head mounted display) in such a manner as to be configured to emit IR light for facilitating eye tracking of a user's eyes by the HMD, the HMD being configured to perform the eye tracking based on detecting and processing IR light reflected off of the user's eyes that is emitted from the set of one or more IR μLEDs.

Figure 11:
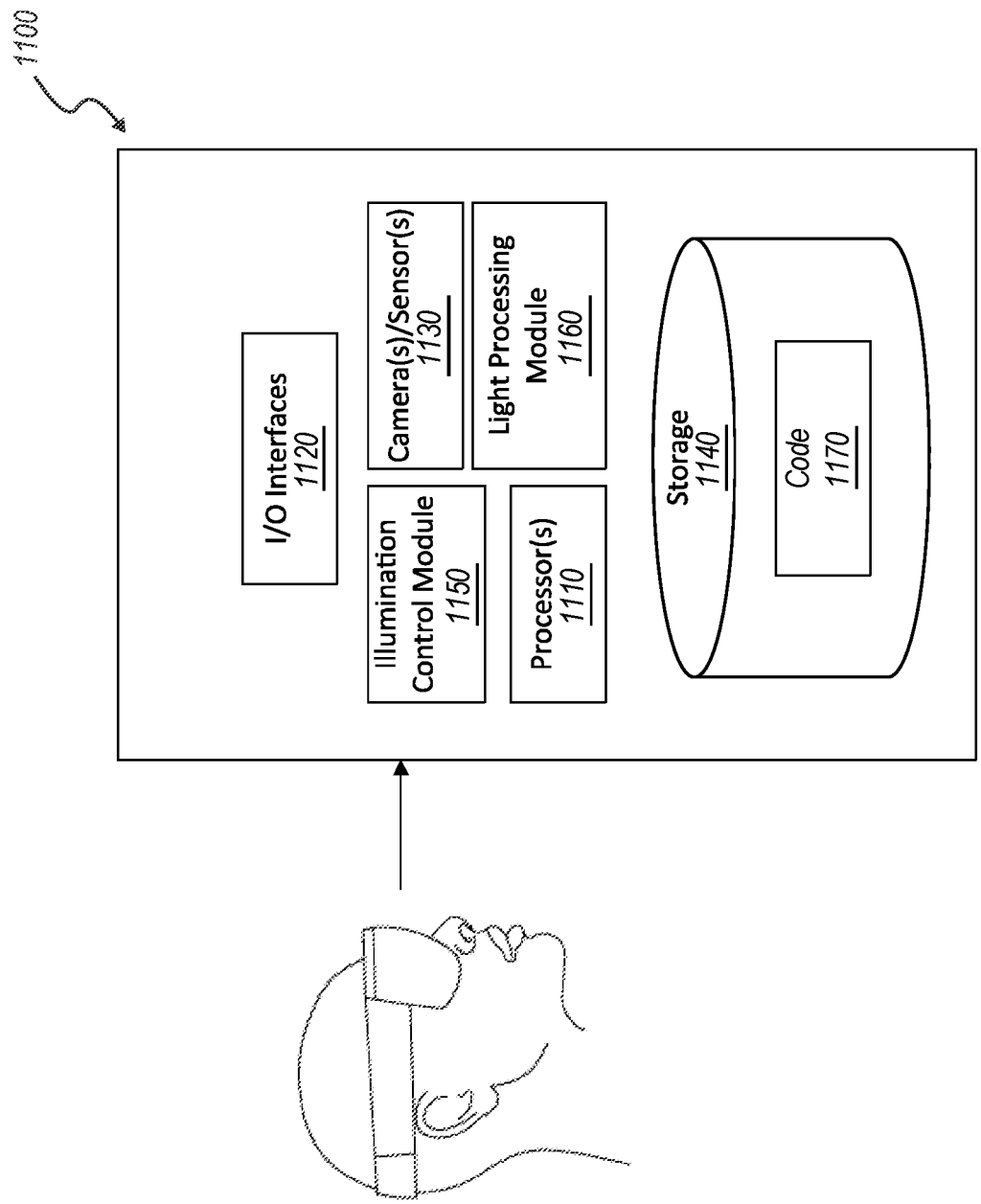
FIG. 11 illustrates an example system that may be used to track a user's eye movements based on IR light reflected off of the user's eyes in response to IR light being emitted from IR µLEDs embedded within or on top of the transparent structures positioned in front the user's eyes.

Attention will now be directed to FIG. 11, which illustrates an exemplary computing system 1100 that can incorporate and/or be used to implement the disclosed embodiments. As used herein, "computer system," "computing system," and simply "computer" are similar terms that may be interchanged with each other. Further, the computer system 1100 may take any form, such as, for example, an HMD.

As illustrated, the computer system 1100 includes at least one hardware processing unit 1110 (aka "processor(s)"), input/output (I/O) interfaces 1120, one or more sensors 1130 (e.g., eye tracking cameras and sensors), and storage 1140. The computer system 1100 also includes various different components that are useful for tracking a user's eye. To illustrate, the computer system 110 includes an illumination control module 1150 and a light processing module 1160. More detail on these components will be discussed later.

Although not shown, the system 1100 may also include graphics rendering engines for rendering images and a power supply for supplying the different components described herein.

The illustrated storage 1140 may be physical system memory, which may be volatile, non-volatile, or some combination of the two. As such, the storage 1140 may be considered a computer-readable hardware storage device that is capable of storing computer-executable instructions (e.g., "code" 1170) that are executable by the processor(s) 1110 to configure the computing system 1100 to implement some of the functionality described herein, including the referenced eye tracking functionality.

In particular, execution of the code 1170 can cause the illumination control module 1150 to activate/power the IR µLEDs/circuits referenced above, to cause IR light to illuminate a user's eye. The execution of the code 1170 can also cause the camera(s)/sensor(s) 1130 to capture and measure the IR light reflections/glints that are reflected off of a user's eye during use and during illumination by the IR µLEDs. Furthermore, The execution of the code 1170 can also cause the light processing module 1160 to convert the measured IR light signals detected by the camera(s) into identifiable position mappings of the user's eye(s).

The various I/O interfaces 1120 are configured to interconnect the various other system components and to also provide interfaces for enabling a user to control the settings and operation of the different system components.

The referenced computer-executable (or computer-interpretable) instructions that are stored as code 1170, and which are executable by the processor(s) comprise, for example, instructions that cause a general-purpose computer, special-purpose computer, or special-purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the embodiments may be practiced in network computing environments with many types of computer system configurations, including personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The embodiments may also be practiced in distributed system environments where local and remote computer systems that are linked (either by hardwired data links, wireless data links, or by a combination of hardwired and wireless data links) through a network each perform tasks (e.g. cloud computing, cloud services and the like). In a distributed system environment, the various system components and code may be located in both local and remote memory storage devices.

Additionally or alternatively, the functionality described herein can be performed, at least in part, by one or more hardware logic components. For example, and without limitation, illustrative types of hardware logic components that can be used include Field-Programmable Gate Arrays (FPGAs), Program-Specific or Application-Specific Integrated Circuits (ASICs), Program-Specific Standard Products (ASSPs), System-On-A-Chip Systems (SOCs), Complex Programmable Logic Devices (CPLDs), Central Processing Units (CPUs), and other types of programmable hardware.

By practicing the principles disclosed herein, significant advantages may be realized, including, but not limited to, the creation and use of transparent illumination lens structures having a plurality of IR µLEDs distributed within the transparent viewing area of the illumination lens structures and that are small enough (<100 µm) that they are not visible by a user during use of an HMD or other mixed-reality device that incorporates the transparent illumination lens structures for illuminating a user's eyes during use for enabling eye tracking and without visibly obscuring or interfering with the user's view of a mixed-reality environment by the mixed-reality device through the transparent illumination lens structures.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method of manufacturing a transparent illumination structure with a plurality of IR µLEDs (infrared micro light emitting devices), the method comprising:
    obtaining a transparent backplane;
    applying a plurality of traces to the transparent backplane, the plurality of traces being electrically conductive and forming at least one electrical circuit between an anode terminal and a cathode terminal;
    obtain a wafer containing a plurality of IR µLEDs; and
    transfer a set of one or more IR µLEDs from the wafer onto the transparent backplane in a predetermined pattern, the set of one or more IR µLEDs being positioned directly onto the traces, IR µLED in the set of one or more IR µLEDs being electrically coupled with the at least one electrical circuit, each IR µLED of the set of one or more IR µLEDs also having a maximum size dimension of <100 µm.

2. The method of claim 1, wherein the method further includes: applying a protective coating over the set of one or more IR µLEDs.

3. The method of claim 1, wherein the predetermined patter is a circular pattern.

4. The method of claim 1, wherein the predetermined pattern is a rectangular pattern.

5. The method of claim 1, wherein the set of one or more IR µLEDs comprises a quantity of IR µLEDs between two and twenty.

6. The method of claim 1, wherein the set of one or more IR µLEDs comprises a quantity of IR µLEDs between three and twelve.

7. The method of claim 1, wherein each IR µLED of the set of one or more IR µLEDs is configured to only emit light having wavelengths above 800 nm.

8. The method of claim 1, wherein each IR µLED of the set of one or more IR µLEDs is configured to emit light having a wavelength of about 850 nm.

9. The method of claim 1, wherein the method further includes: separating a segment of the transparent backplane from a remaining portion of the transparent backplane, the segment of the transparent backplane including the least one electrical circuit with the set of one or more IR µLEDs.

10. The method of claim 9, wherein the method further includes electrically and mechanically coupling the segment of the transparent backplane to a HMD (head mounted display) as an illumination lens, the illumination lens being configured to emit IR light for facilitating eye tracking of a user's eyes by the HMD, the HMD being configured to perform the eye tracking based on detecting and processing IR light reflected off of the user's eyes that is emitted from the set of one or more IR μLEDs.

11. The method of claim 10, wherein the set of one or more IR μLEDs are positioned within the illumination lens in such a configuration as to be within a line-of-sight by the user when the user wears the HMD during use.

12. The method of claim 11, wherein the HMD is a mixed-reality device that renders one or more virtual objects to the user during use of the HMD, the one or more virtual objects being positioned relative to the user's eyes based on a determined orientation or gaze of the user's eyes that is determined in part on the eye tracking of the user's eyes.

13. The method of claim 1, wherein the transparent backplane is a rigid glass structure.

14. The method of claim 1, wherein the transparent backplane is a flexible plastic structure.

15. A method for configuring an HMD device to perform eye tracking, the HMD including an illumination display component that contains a plurality of IR μLEDs, each IR μLED of the plurality of IR μLEDs having a maximum size dimension of <100 μm, the method comprising:
  configuring the HMD with the illumination display component in such a manner that at least one of the IR μLEDs, which is contained inside of a peripheral edge boundary of the illumination display component, is positioned in a user line-of-sight area that passes through the illumination display component;
  configuring the HMD to emit IR light from one or more of the IR μLEDs in the illumination display component towards an eye of the user during the use of the HMD;
  configuring the HMD to detect and process glints of the IR light that is reflected back from the user's eye during the use of the HMD; and
  configuring the HMD to determine a positioning of the user's eye based on the detected and processed glints.

16. The method of claim 15, wherein the plurality of IR μLEDs comprises a quantity of IR μLEDs between two and twenty.

17. The method of claim 15, wherein each IR μLED of the plurality of IR μLEDs is configured to only emit light having wavelengths above 800 nm.

18. An HMD configured to perform eye tracking, the HMD comprising:
  an illumination display component that contains a plurality of IR μLEDs, each IR μLED of the plurality of IR μLEDs having a maximum size dimension of <100 μm, at least one of the IR μLEDs being positioned inside of a peripheral edge boundary of the illumination display component, so as to be positioned in a user line-of-sight area passing through the illumination display component;
  a camera sensor configured to detect IR light emitted from the at least one IR μLED and that is reflected from a user's eye during use of the HMD; and
  a light processing module configured to identify positioning of the user's eye based on processing signals generated from the detected IR light that is reflected from the user's eye during use of the HMD.

19. The HMD recited in claim 18, wherein the HMD is further configured to generate and render one or more virtual objects to the user, during use of the HMD, based at least in part on the identified positioning of the user's eye.

20. The HMD recited in claim 18, wherein the HMD is further configured with an illumination control for selectively and controllably illuminating said at least one of the IR μLED separately from one or more other IR μLED of the plurality of μLEDs.

* * * * *